US012625284B1

(12) United States Patent
Sweany et al.

(10) Patent No.: US 12,625,284 B1
(45) Date of Patent: May 12, 2026

(54) SILICON PHOTOMULTIPLIERS EMBEDDED IN SCINTILLATOR

(71) Applicant: National Technology & Engineering Solutions of Sandia, LLC, Albuquerque, NM (US)

(72) Inventors: Melinda Dominique Sweany, Oakland, CA (US); Kyle James Weinfurther, Livermore, CA (US); Patrick L. Feng, Livermore, CA (US); Peter Anthony Marleau, Dublin, CA (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 177 days.

(21) Appl. No.: 18/678,502

(22) Filed: May 30, 2024

(51) Int. Cl.
*G01T 1/20* (2006.01)
*H10W 90/00* (2026.01)

(52) U.S. Cl.
CPC ...... *G01T 1/20187* (2020.05); *G01T 1/20184* (2020.05); *G01T 1/20188* (2020.05); *H10W 90/00* (2026.01)

(58) Field of Classification Search
CPC ............. G01T 1/20187; G01T 1/20184; G01T 1/20188; H01L 25/167
See application file for complete search history.

(56) References Cited

U.S. PATENT DOCUMENTS

| | | | |
|---|---|---|---|
| 8,969,812 B2 | 3/2015 | Yoshikawa et al. | |
| 9,845,334 B1 * | 12/2017 | Feng .................... | C07F 9/5325 |
| 10,508,233 B1 | 12/2019 | Feng et al. | |
| 11,681,055 B1 * | 6/2023 | Carlson ................ | H10F 39/014 |
| | | | 250/367 |
| 11,795,388 B2 | 10/2023 | Myllenbeck et al. | |
| 2010/0316184 A1 | 12/2010 | Iwanczyk et al. | |
| 2018/0136344 A1 * | 5/2018 | Nelson ............... | G01T 1/20181 |
| 2022/0403235 A1 | 12/2022 | Myllenbeck et al. | |
| 2023/0314634 A1 | 10/2023 | Carlson et al. | |

* cited by examiner

*Primary Examiner* — Uzma Alam
*Assistant Examiner* — Fani Polyzos Boosalis
(74) *Attorney, Agent, or Firm* — Kenneth Paul McNeill

(57) ABSTRACT

A scintillator having a silicon photomultiplier (SiPM) embedded therein is described. The scintillator comprises an amorphous organic glass scintillator (OGS) material having a glass transition temperature above which the OGS material behaves as a supercooled or stable liquid, and a SiPM having a lead coupled thereto and having a temperature tolerance greater than the glass transition temperature of the OGS material. The SiPM is positioned in the OGS material while the OGS material is in a liquid state above the glass transition temperature, and the OGS material is cooled to an amorphous solid state below the glass transition temperature with the SiPM embedded therein.

20 Claims, 10 Drawing Sheets

702 — START

700

704 — PROVIDE SiPM(s) WITH LEAD(s) ATTACHED THERETO

706 — BEGIN PRINTING SCINTILLATOR

708 — PAUSE PRINTING AND PLACE SiMP(s) IN SCINTILLATING MATERIAL WITH LEADS PROTRUDING

710 — CONTINUE PRINTING SCINTILLATOR

712 — FINISH PRINTING SCINTILLATOR WITH LEADS PROPTRUDING OUT OF SCINTILLATOR

714 — END

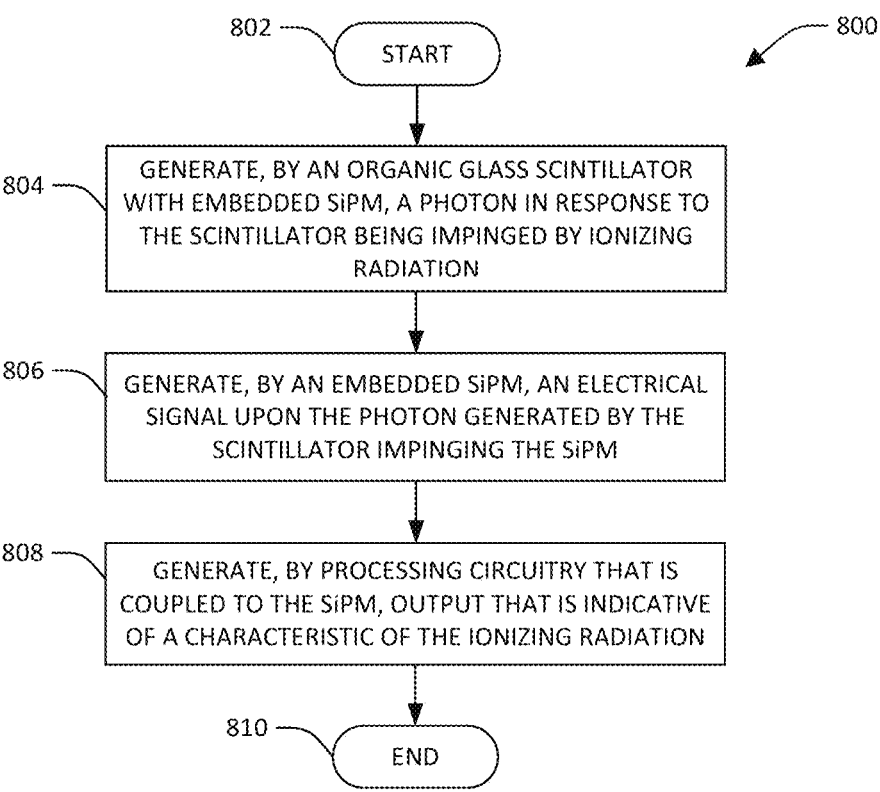

802 — START — 800

804 — GENERATE, BY AN ORGANIC GLASS SCINTILLATOR WITH EMBEDDED SiPM, A PHOTON IN RESPONSE TO THE SCINTILLATOR BEING IMPINGED BY IONIZING RADIATION

806 — GENERATE, BY AN EMBEDDED SiPM, AN ELECTRICAL SIGNAL UPON THE PHOTON GENERATED BY THE SCINTILLATOR IMPINGING THE SiPM

808 — GENERATE, BY PROCESSING CIRCUITRY THAT IS COUPLED TO THE SiPM, OUTPUT THAT IS INDICATIVE OF A CHARACTERISTIC OF THE IONIZING RADIATION

810 — END

FIG. 8

SILICON PHOTOMULTIPLIERS EMBEDDED IN SCINTILLATOR

STATEMENT OF GOVERNMENTAL INTEREST

This invention was made with Government support under Contract No. DE-NA0003525 awarded by the United States Department of Energy/National Nuclear Security Administration. The U.S. Government has certain rights in the invention.

BACKGROUND

A scintillation detector includes a scintillator that scintillates (generates photons) upon ionizing radiation impinging upon the scintillator. The scintillation detector also includes a photodetector that detects photons generated by the scintillator (e.g., converts photons to electrons). The scintillation detector further includes processing circuitry that generates an output that is indicative of a characteristic of the ionizing radiation based upon electrons output by the photodetector. For example, the output can indicate that the ionizing radiation is gamma radiation (rather than a neutron impinging upon the scintillator) and that the gamma radiation has a particular energy. Conventionally, the photodetector in a scintillation detector is a photomultiplier tube (PMT). PMTs utilize the photoelectric effect to convert a photon to an electron and include a vacuum-housed dynode chain to focus and amplify the photoelectron into many secondary electrons where they are collected on an anode pad that can be read out for further analysis. PMTs are a relatively mature technology capable of single photon quantum efficiencies of up to 35%. PMTs, however, have several drawbacks, such as size (PMTs have relatively large volumes compared to their photosensitive areas) and ruggedness (PMTs are relatively fragile).

An alternative technology to a PMT that addresses these drawbacks is a photodetector that includes solid-state single photon avalanche diodes (SPADs). SPADs are commonly found in silicon photomultipliers (SiPMs), where a SiPM includes thousands to tens of thousands of micron-scale SPADs (where a micron-scale SPAD is referred to herein as a microcell). In a SiPM, microcells are arrayed together into millimeter-scale photodetectors. SiPMs are more compact than PMTs, are more robust than PMTs, and require less power to operate than PMTs.

Scintillation detectors find application in petroleum drilling and exploration, radiation protection, medical imaging, high-energy particle physics, and radioactive material detection and characterization. Such detectors can be configured to detect various types of radiation, such as alpha radiation, beta radiation, gamma radiation, or neutron radiation. Conventionally, scintillation detectors have employed a scintillator that is optically coupled to a photomultiplier tube to detect the interaction of radiation with the scintillator. More recently, pixelated arrays of SiPMs capable of detecting single-photon events have been developed. In some applications, a scintillator coupled to a SiPM can result in improved light collection in high aspect ratio scintillators.

Materials used for scintillators have included stilbene crystals and certain types of radioluminescent plastics. However, these materials are poorly suited for irregularly shaped scintillators, as they generally must be cut from a larger crystal or other element and then polished to achieve desired light emission and propagation characteristics. For irregularly shaped scintillators, these machining operations risk damaging the scintillator, reducing manufacturing yield, reliability, and/or performance. Moreover, conventionally, SiPMs and PMTs are mounted to a flat exterior surface of the scintillator. Providing flat surfaces on the scintillator to mount the photodetector further reduces manufacturing yield by increasing manufacturing time and imposes constraints on the shape of the scintillator.

SUMMARY

The following is a brief summary of subject matter that is described in greater detail herein. This summary is not intended to be limiting as to the scope of the claims.

Described herein are various technologies pertaining to organic glass scintillators having SiPMs embedded therein. When manufacturing the described scintillator, a computing system (e.g., a control module or the like) controls a heating element to heat an organic glass scintillator (OGS) material beyond its glass transition temperature to make the OGS material a supercooled or stable liquid that exhibits supercooled liquid characteristics including, e.g., viscous flow. In an example, one or more SiPMs having leads coupled thereto are positioned in an interior cavity of a mold (e.g., a silicone mold or the like) with their respective leads protruding therefrom. The mold is filled with the liquid OGS material, surrounding the SiPMs and the portions of their respective leads that are within the mold cavity. The liquid OGS material is cooled until it reaches an amorphous solid state with the SiPMs embedded in the solidified amorphous scintillator material with their leads protruding therefrom for connection to processing circuitry (also referred to herein as "read-out circuitry"). In one embodiment, an active cooling component is provided to expedite the cooling of the scintillator material in order to minimize the amount of time the SiPMs are subjected to potentially damaging heat.

In another embodiment, read-out circuitry is inserted into the liquid OGS material with the SiPMs. For instance, the read-out circuitry can be preconnected to the SiPMs and inserted into the liquid OGS material. A lead coupled to the read-out circuitry can be left protruding from the OGS material for coupling to a computing system and/or display or the like.

According to an embodiment, the OGS material has a glass transition temperature $T_g$ in the range of, for example, 25° C. to 200° C. When the glass transition temperature of the OGS material is above a temperature tolerance for the SiPM being embedded therein (e.g., a temperature above which the SiPM may become damaged), a plasticizer additive can be added to the OGS material to reduce its glass transition temperature to be lower than the temperature tolerance for the SiPM. Plasticizer additives may also be used to reduce the melt viscosity at a given temperature above $T_g$ to facilitate improved melt casting around the embedded SiPMs.

Using the described techniques, solid scintillators are generated to have shapes, aspect ratios, etc. that are not constrained by a need for flat surfaces to which SiPMs conventionally are mounted. Embedding the SiPMs in the scintillator permits the SiPMs to detect internally reflected light that otherwise would not escape the scintillator for detection by surface mounted SiPMs. This feature results in improved radiation detection compared to conventional scintillators with surface mounted SiPMs. Additionally, the scintillator can be formed to have any shape for which a mold can be constructed. Therefore, scintillators having irregular and/or customized shapes can be provided for fitting into custom spaces within a scintillation detector housing, which facilitates reducing detector size, weight, cost, etc.

According to another embodiment, SiPMs having leads coupled thereto can be positioned within a 3D printer. OGS material can be printed on and around the SiPMs and their respective leads. The free ends of the leads can be left protruding from the printed scintillator for connecting to processing circuitry in a scintillation detector. In another embodiment, scintillator printing is periodically paused for insertion of the SiPMs into the printed material and then resumed. The leads are left protruding from the printed scintillator for connecting to processing circuitry.

In another embodiment, internal and/or external reflective material can be employed in and/or on the scintillator. Internal reflective materials can be selected to have a higher melting point than the highest temperature to which the OGS scintillator material is subjected during scintillator formation. Internal reflective material can be mixed into or otherwise inserted into the scintillator material while in a liquid state and reflects light inside the scintillator into the SiPM for detection. External reflective material can be wrapped around or otherwise positioned on external surfaces of the solidified scintillator to reflect escaping light back into the scintillator material, where it can be detected by the SiPM (s). Non-limiting examples of internal reflective materials may include, e.g., 3M Enhanced Specular Reflector film (Vikuiti ESR), $TiO_2$-coated sheets, metalized substrates or foils, etc. Non-limiting examples of external reflective materials may include, e.g., 3M Enhanced Specular Reflector film (Vikuiti ESR), $TiO_2$-coated sheets, metalized substrates or foils, etc.

The above summary presents a simplified summary in order to provide a basic understanding of some aspects of the systems and/or methods discussed herein. This summary is not an extensive overview of the systems and/or methods discussed herein. It is not intended to identify key/critical elements or to delineate the scope of such systems and/or methods. Its sole purpose is to present some concepts in a simplified form as a prelude to the more detailed description that is presented later.

BRIEF DESCRIPTION OF THE DRAWINGS

FIG. 8 illustrates a method for using a scintillation detector having an embedded SiPM is illustrated.

DETAILED DESCRIPTION

Figure 1:
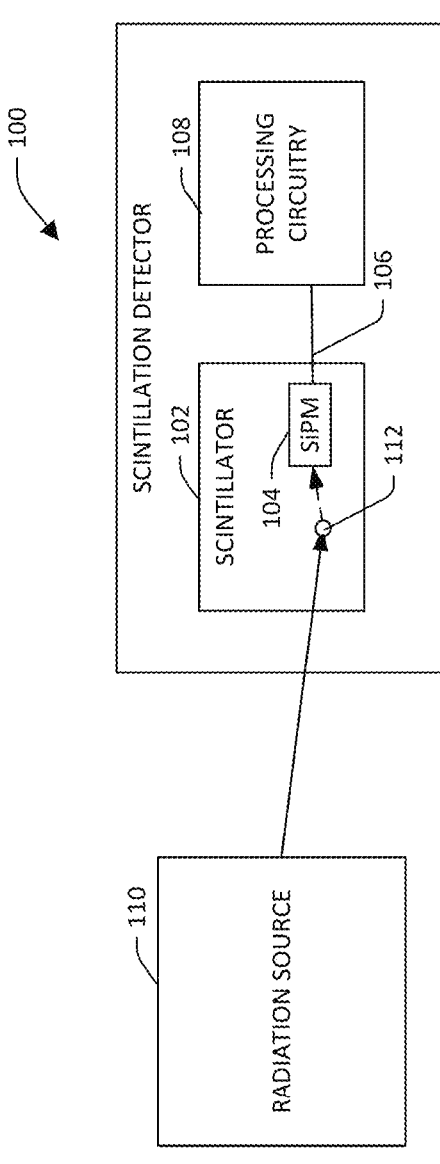
FIG. 1 is a schematic of a scintillation detector with an embedded SiPM.

Various technologies pertaining to scintillation detectors are now described with reference to the drawings, wherein like reference numerals are used to refer to like elements throughout. In the following description, for purposes of explanation, numerous specific details are set forth in order to provide a thorough understanding of one or more aspects. It may be evident, however, that such aspect(s) may be practiced without these specific details. In other instances, well-known structures and devices are shown in block diagram form in order to facilitate describing one or more aspects. Further, it is to be understood that functionality that is described as being carried out by certain system components may be performed by multiple components. Similarly, for instance, a component may be configured to perform functionality that is described as being carried out by multiple components.

Moreover, the term "or" is intended to mean an inclusive "or" rather than an exclusive "or." That is, unless specified otherwise, or clear from the context, the phrase "X employs A or B" is intended to mean any of the natural inclusive permutations. Hence, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

Described herein are various technologies related to scintillation detectors. More specifically, the described features relate to organic glass scintillators (OGSs) having silicon photomultipliers (SiPMs) embedded therein. SiPMs offer improvements in photon detection performance, size, weight, power, and robustness when compared to photomultiplier tubes (PMTs). Additively manufacturing scintillating materials enables rapid construction of close-packed arrays and other non-standard shapes. In conventional scintillation detectors where SiPMs are coupled to a flat surface of an exterior of a scintillator, reading out the scintillation light can be a challenge: light propagation through complex shapes leads to a reduction of light exiting the flat surface of the scintillator where the SiPMs are mounted, which negatively impacts performance of the scintillation detectors. Described herein are systems and methods for embedding SiPMs into scintillators. Embedding SiPMs into scintillators improves light collection because the light need not propagate long distances in the scintillator in order to exit the scintillator and be detected by a detector (such as a SiPM or PMT). Embedding SiPMs into the scintillator also protects the SiPMs from temperature changes and radiation damage that the SiPMs would be exposed to if placed external to the scintillator. With the SiPM embedded inside the scintillator, the scintillator provides a buffer against rapid temperature changes and also provides shielding against ionizing radiation.

Conventionally, the main technology used in radiation detection has been scintillating material coupled to PMTs. Recently, there has been rapid technical development and cost reductions in SiPMs, which now offer significant improvements over PMTs in photon detection efficiency, counting resolution, timing resolution, size, weight, and power consumption (SWaP), and physical robustness. Reproducing typical PMT surface area requires arrays of many SiPMs, which when passively summed, can be used as PMT replacements.

With more particularity, technologies described herein pertain to a scintillation detector that includes a scintillator that comprises an Organic Glass Scintillator (OGS) material; the OGS can be a material or a combination of materials disclosed in U.S. Pat. Nos. 9,845,334, 10,508,233, and 11,681,055, the entireties of which are incorporated herein by reference in their entirety. Scintillation detectors described herein can be manufactured using non-subtractive methods such as mold casting to form scintillator elements, which can improve the manufacturing yield, reliability, and/or performance of the radiation detectors relative to conventional radiation detectors that rely on stilbene or plastic scintillators.

Detecting scintillation light is a challenge: light propagation through bar-shaped scintillators with high aspect ratios and complex shapes often leads to a reduction of light exiting any particular surface of the scintillator due to the large number of internal reflections necessary to reach a conventional surface-mounted photodetector. This reduction in detectable light negatively impacts performance metrics such as energy resolution and the ability to perform neutron/gamma particle identification with pulse shape discrimination techniques.

By embedding SiPMs into cast OGS assemblies, light collection is improved because the light no longer needs to propagate long distances or through sharp corners to reach a photodetector. Even for a standard right cylindrical shape, distributing SiPMs throughout the volume can contribute to light collection efficiency when compared to conventional approaches that read out one end of the cylinder. Embedding SiPMs into an OGS scintillator facilitates achieving conventional performance metrics with fewer SiPMs and thus less power than historically needed. In addition, embedding SiPMs into the scintillator volume mitigates two problems with SiPMs, which are the increase in dark counts and drop in photoelectron gain as a function of temperature, and susceptibility of SiPMs to radiation damage. With the SiPM embedded inside the scintillator, the scintillator provides a buffer against rapid temperature changes as well as shielding against ionizing radiation.

With reference now to FIG. 1, a schematic of a scintillation detector 100 is presented. The scintillation detector 100 includes a scintillator 102 that comprises scintillating material. The scintillator 102 includes a SiPM 104 embedded therein, the SiPM having a lead 106 coupled thereto that extends out of the scintillator 102. The detector 100 also includes processing circuitry 108 (also referred to herein as "read-out circuitry"), where the lead 106 is further coupled to the processing circuitry 108. The processing circuitry 108 receives an output signal from the SiPM 104 and generates output based upon the output signal. It will be understood by one of skill in the art that although a majority of the Figures described herein show the SiPM leads as protruding from the scintillator for coupling to processing circuitry, in other embodiments the processing circuitry is embedded in the scintillator along with the embedded SiPMs. In this scenario, a main lead from the processing circuitry is provided for communicatively coupling the processing circuitry to an external computing system and/or display.

Embedding the SiPM 104 in the scintillator 102 protects the SiPM 104 from temperature changes and ionizing radiation. Additionally, the embedded SiPM 104 can detect light that is internally reflected in the scintillator 102 and unable to escape, which would be undetectable by conventional detectors that are positioned external to the scintillator 102. Moreover, embedding the SiPM in the scintillator 102 permits the scintillator 102 to have any desired shape because the scintillator 102 is not subject to constraints associated with conventional surface-mounted detectors, which require flat external surfaces for mounting the detectors. Scintillators having customized shapes can be generated, which can facilitate reducing detector size and/or profile and improving performance.

In one embodiment, the scintillator 102 is formed by placing the SiPM 104 into the scintillating material while the scintillating material is in a liquid state, where a free end of the SiPM lead 106 is kept outside of the scintillating material. The scintillating material is cooled until the scintillating material reaches a vitreous, glassy solid state. The lead 106 is coupled to the processing circuitry 108. In another embodiment, the SiPM 104 and lead 106 can be placed in a 3D printer and the scintillator 102 can be 3D printed on and around the SiPM 104 and lead 106 with the free end of the lead 106 protruding from the scintillator 102. In yet another embodiment, the scintillator 102 is 3D printed, and printing is periodically paused for SiPM insertion while the scintillating material; thereafter 3D printing of the scintillating material is resumed. The SiPMs can be inserted robotically or manually.

Operation of the scintillation detector 100 is now described. Ionizing radiation emitted by a radiation source 110 impinges upon the scintillating material of the scintillator 102. The scintillator 102 generates a photon 112 upon the ionizing radiation impinging upon the scintillator 102, and the photon impinges upon the SiPM 104. The SiPM 104 converts the photon into an electron and generates an output (electrical) signal based upon the photon. The processing circuitry 108 generates output based upon the output signal from the SiPM 104 received via the lead 106. In an example, the output can identify a type of ionizing radiation (e.g., whether the ionizing radiation is a neutron or a gamma particle) and indicate an energy of the particle. As noted above, the scintillation detector 100 can have improved performance relative to conventional scintillation detectors, as the scintillator 102 can be formed in any desired shape (as SiPMs embedded in the scintillator 102 can detect light travelling in an interior of the scintillator 102). This feature improves performance and can also facilitate reducing the size of the scintillation detector 100, as the size of the detector is no longer constrained by the shape of the scintillator.

In one embodiment, the OGS material has a relatively low glass transition temperature. For instance, the glass transition temperature is in the range of 25° C. to 200° C. The SiPMs can be placed in the supercooled or stable liquid OGS material without damaging the SiPMs. Once the SiPMs are positioned in the liquid OGS material, the OGS material is cooled to form an amorphous solid scintillator 102 with SiPMs embedded therein.

Figure 2:
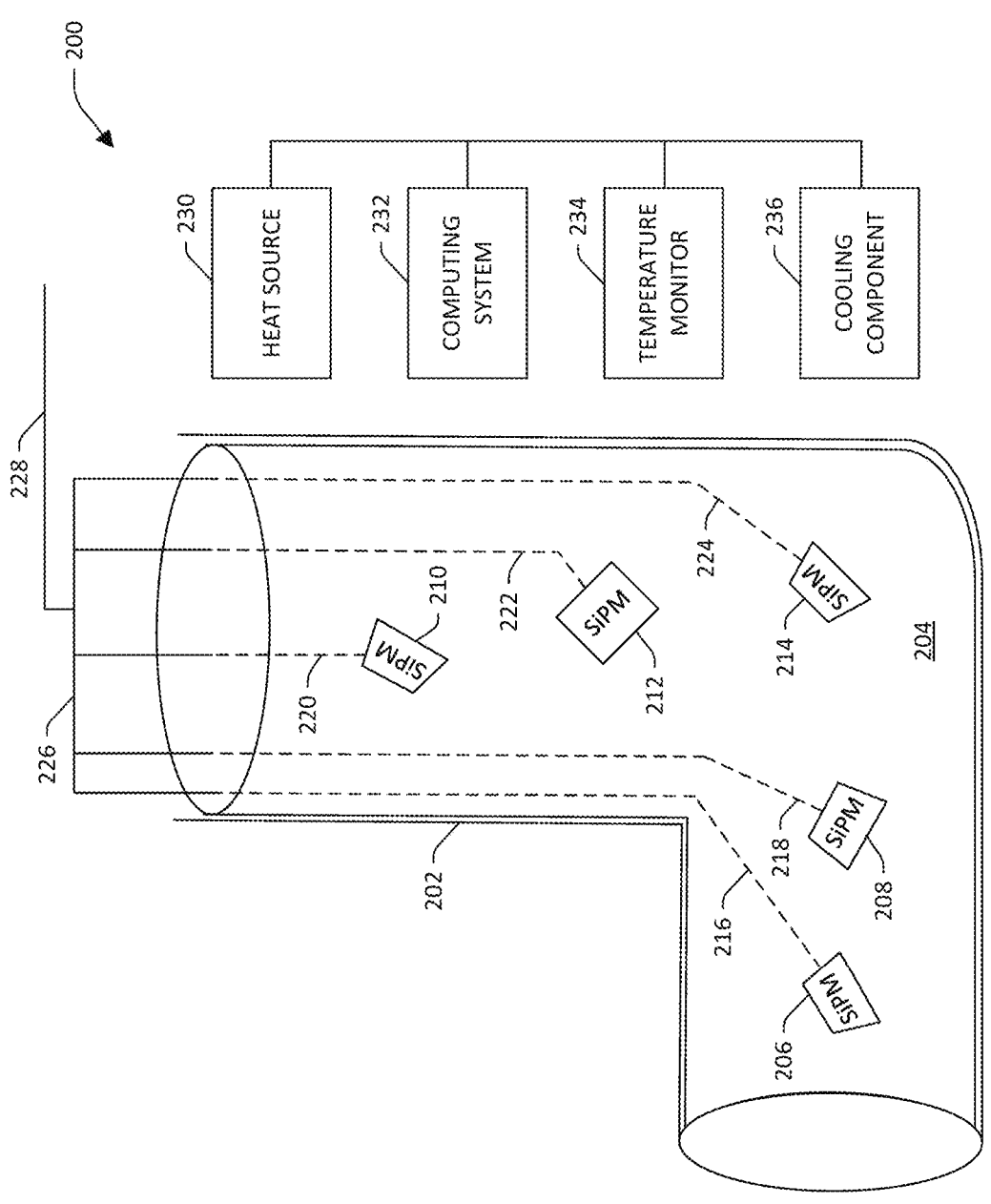
FIG. 2 illustrates a system for manufacturing a scintillator having SiPMs embedded therein.

FIG. 2 illustrates a system 200 for manufacturing a scintillator having SiPMs embedded therein, in accordance with one or more features described herein. A mold 202 is provided, into which liquid scintillating material 204 can be flowed or poured. In one embodiment, the mold 202 comprises a silicone material, although other suitable materials may be employed. The mold 202 can be shaped to generate a scintillator of a desired shape for a given application. SiPMs 206-214 are shown inserted into the scintillating material 204 while the scintillating material 204 is in a liquid or liquidlike state. Free ends of leads 216-224 are left protruding from the liquid scintillating material 204 and the mold 202. In an embodiment, the free ends of leads 216-224 are connected to a bus 226. The bus 226 is connected to a main lead 228, which can be coupled to processing circuitry. In another embodiment, the protruding ends of leads 216-224 are connected directly to the processing circuitry.

A heat source 230 is provided, which maintains the scintillating material 204 in a liquid state during scintillator manufacture. A computing system 232 is in communication with the heat source 230. The system 200 also comprises a temperature monitor 234 that is coupled to and in communication with the computing system 232. The temperature monitor 234 provides information to the computing system 232 regarding the temperature of the scintillation material 204. In order to maintain the scintillating material 204 at a desired viscosity, the computing system controls the heat source 230 to raise the temperature to a desired level when the temperature is too low. The system 200 also optionally includes a cooling component 236 (e.g., active cooling, cold plate, or the like) that is coupled to the computing system 232. The computing system 232 causes the cooling component 236 to reduce the temperature of the scintillating material when it is above a desired temperature. Once the SiPMs 206-214 have been positioned in the scintillating material 204, the temperature of the scintillating material 204 is reduced to place the scintillating material 204 in an amorphous solid state. Solidifying the scintillating material by cooling can be performed passively by letting the scintillating material 204 cool, or actively when the computing system 232 activates the cooling component 236.

In one embodiment, the scintillating material 204 is OGS material. The temperature of the OGS material can be raised to and maintained at e.g., 25° C. to 200° C. to maintain the OGS material at a desired viscosity. In another embodiment, the temperature of the OGS material is maintained between e.g., 50° C. to 150° C. In another embodiment, the SiPMs 206-214 can be positioned in the mold 202 with their respective leads 216-224 protruding from the mold 202 prior to filling the mold with the liquid scintillating material 204 (e.g., OGS material or the like). It is also noted that the SiPMs 206-214 can be oriented in different directions within the scintillating material 204. SiPMs 206, 208, 210, and 214 are illustrated to have a trapezoidal shape indicative of their orientation into and out of the page. SiPM 212 is illustrated as having a rectangular shape representing its orientation in the plane of the page. Moreover, the SiPMs 206-214 can have different rotational orientations relative to normal.

As mentioned above, the herein-described scintillator(s) 102 (and 302 and 502; see FIGS. 3-5) can comprise an OGS material. The scintillator 102, 302, 502 can further include at least one of a plasticizer additive or a polymer additive. Plasticizer and polymer additives can reduce the incidence of bubble formation and cracking due to thermal stresses and can also reduce the glass transition temperature of the OGS material. In non-limiting embodiments, the plasticizer additive can be or include any of various boron-containing compounds such as 2-(p-tolyl)-1,3,2-dioxaborinane (TDB), 1,3,5-tris(4,4,5,5-tetramethyl-1,3,2-dioxaborolan-2-yl)benzene (1,3,5-TrBB'), 2,2',2"-(benzene-1,2,4-triyl)tris(4,4,5,5-tetramethyl-1,3,2-dioxaborolane) (1,2,4-TrBB'), or the like, or an alkyl benzene such as mesitylene, xylenes, pseudocumene, etc. In further non-limiting embodiments, the polymer additive can be or include polystyrene (PS), polyvinyl toluene (PVT), polymethyl methacrylate (PMMA). Other relevant categories of potential plasticizer additives comprise carboxylate-containing compounds including citrates, benzoates, phthalates, adipates, or sebacates, In various embodiments, the plasticizer additive can be present at between 0.5-10 wt % of the total weight of the scintillator. In further embodiments, the polymer additive can be present at between 0.5-10 wt % of the total weight of the scintillator 102, 302, 502.

Each scintillator 102, 302, 502 can be formed within a mold that is configured to accept liquid OGS material that is heated above its glass transition temperature and to form the OGS material into a desired final shape of the scintillator 102, 302, 502. By way of example, the mold can include an interior cavity that has a same shape as the desired final shape of the scintillator 102, 302, 502. Liquid OGS material can be added to the interior cavity and then cooled to form an amorphous solid scintillator 102, 302, 502. In some embodiments, the mold can be retained as a component of a scintillation detector, holding one or a plurality of scintillators 102, 302, 502 in place. In other embodiments, the scintillator 102, 302, 502 can be formed by extrusion techniques rather than mold-based casting.

According to an embodiment, when positioning the SiPMs in the mold (either before or after filling the mold with the liquid scintillating material), a minimum predetermined distance can be maintained between the SiPMs and an outer surface of the scintillator 102, 302, 502. According to an example, a minimum distance of one radiation attenuation length (e.g., on the order of centimeters or the like) can be employed. A radiation attenuation length is defined as the distance into a material at which the probability that a particle has not been absorbed has dropped to $1/e$ (i.e., approximately 37%). It will be understood that attenuation length may vary depending on the OGS material, plasticizer added, type of radiation being detected, etc.

Figure 3:
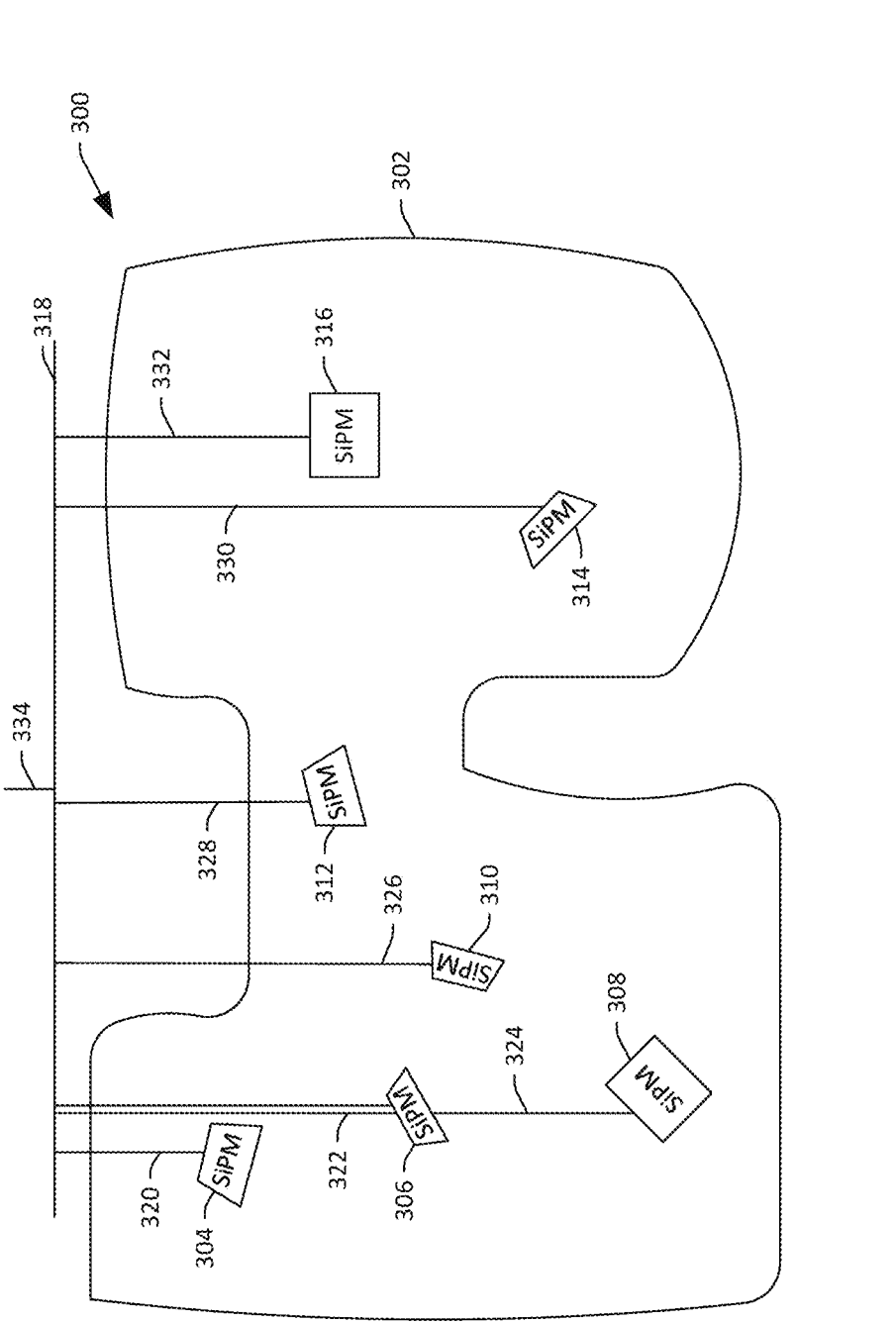
FIG. 3 illustrates an example of an irregularly shaped scintillator.

With reference to FIG. 3, an example 300 of an irregularly shaped scintillator 302 is illustrated, in accordance with one or more features described herein. A plurality of SiPMs 304-316 having different orientations are embedded in the scintillator 302. Respective leads 320-332 are provided. A bus 318 is also provided, to which the SiPMs 304-316 are coupled by their respective leads 320-332. A main lead 334 is coupled to the bus 318 and can be coupled to processing circuitry (not shown in FIG. 3). In another embodiment, the protruding ends of leads 320-332 are connected directly to the processing circuitry (not shown in FIG. 3). The puzzle piece-like shape of the scintillator 302 in the example 300 of FIG. 3 is not to be construed in a limiting sense. Rather, the shape is illustrated so show that a solid scintillator 302 of any desired shape can be generated using the herein-described systems, methods, techniques, etc.

Figure 4:
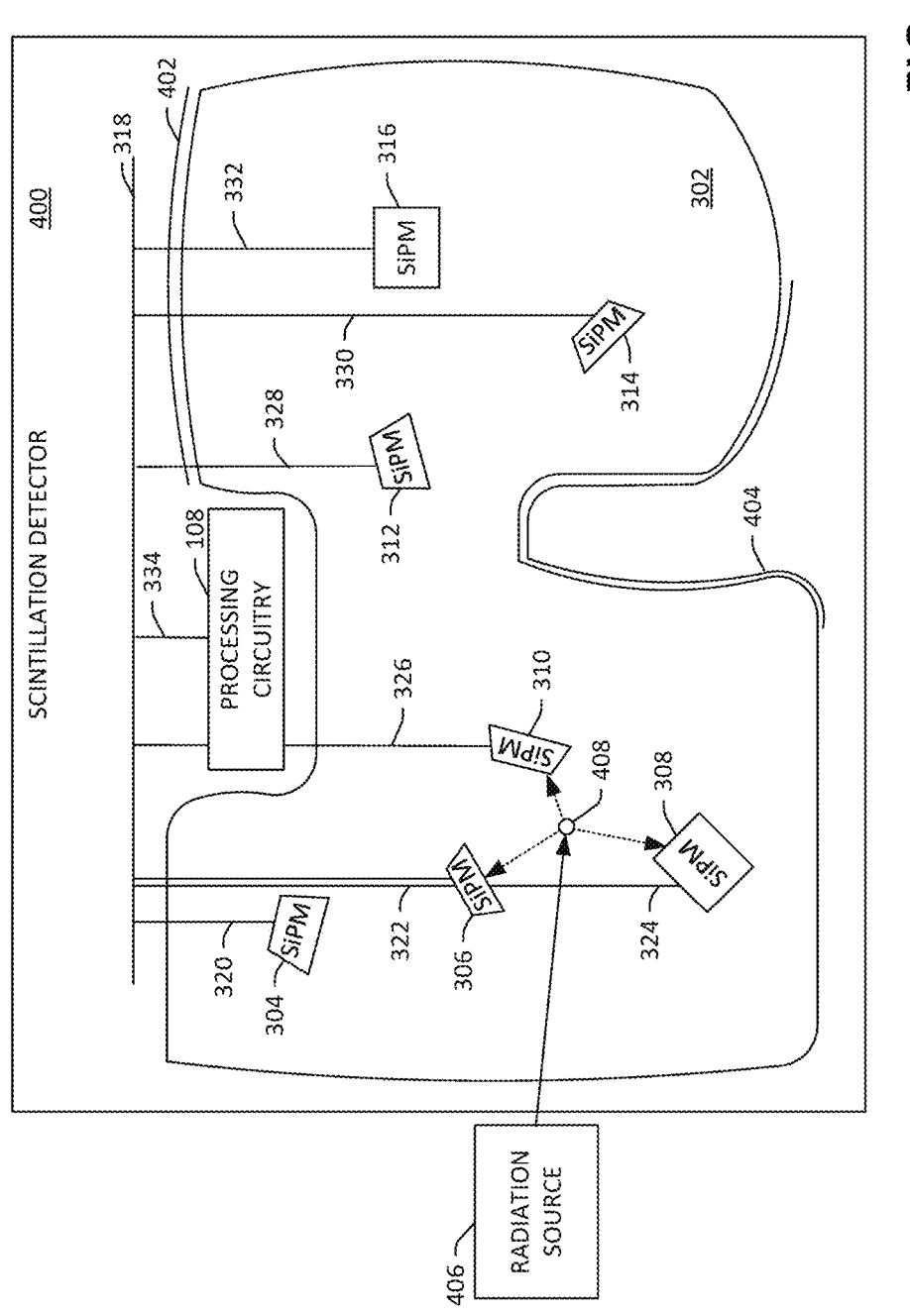
FIG. 4 illustrates a scintillation detector employing the irregularly shaped scintillator.

Referring to FIG. 4, a scintillation detector 400 is illustrated, in accordance with one or more features described herein. The scintillation detector 400 comprises an irregularly shaped scintillator 302 with a plurality of SiPMs 304-316 having different orientations embedded in the scintillator 302. Respective leads 320-332 are provided. A bus 318 is also provided, to which the SiPMs 304-316 are coupled by their respective leads 320-332. A main lead 334 is coupled to the bus 318 that is coupled to processing circuitry 108. In another embodiment, the protruding ends of leads 320-332 are connected directly to the processing circuitry 108. The puzzle piece-like shape of the scintillator 302 in the example of FIG. 4 is not to be construed in a limiting sense. Rather, the shape is illustrated so show that a solid scintillator 302 of any desired shape can be generated using the herein-described systems, methods, techniques, etc.

The scintillation detector also includes retaining structures 402, 404. The irregular shape of the scintillator 302 in the example of FIG. 4 accommodates the processing circuitry 108 and the retaining structures 402, 404 that keep the scintillator 302 from moving within the scintillation detector 400. For example, a first retaining structure 402 can prevent the simulator 302 from moving in a first direction (e.g., upward in the illustrated depiction), and a second retaining structure 404 can prevent the scintillator 302 from moving in a second, third, and fourth direction (e.g., left, right, and downward in the illustrated depiction).

Also illustrated in FIG. 4 is a radiation source 406 that emits radiation that causes a scintillation event 408 within the scintillator 302. The scintillation event 408 occurs when high energy photons such as X-rays or gamma rays, or high energy particles such as electrons, alpha particles, neutrons, ions, etc., are absorbed by the scintillation material of the scintillator 302 and cause the scintillator 302 to emit visible or ultraviolet light. The emitted light is detected by one or more SiPMs 306, 308, 310, which transmit respective signals back to the processing circuitry 108. The processing circuitry 108 produces an output that indicates that a scintillation event 106 has occurred. Additionally, based on the signals received from the SiPMs 306, 308, 310, the processing circuitry 108 can output an indication of the magnitude of the scintillation event 408 and/or the type of the radiation source 406.

Figure 5A:
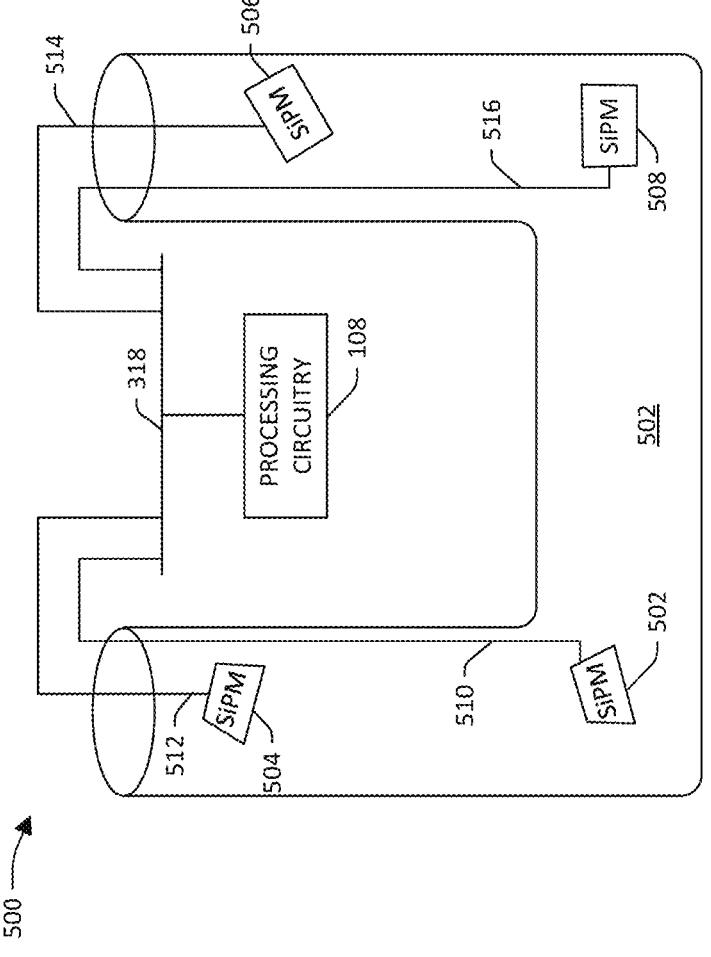
FIG. 5A shows another scintillation detector with embedded SiPMs.

FIG. 5A shows another scintillator detector 500, in accordance with one or more features described herein. The scintillator detector 500 comprises a u-shaped cylindrical scintillator 502 and a plurality of SiPMs 504-512 embedded therein. The SiPMs 504-512 coupled to respective leads 516-524. Bus 318 is also provided and is coupled to the respective leads 516-524. Processing circuitry 108 is coupled to the bus and receives output signals from the respective SiPMs 504-512 via the respective leads 516-524. It will be understood that the herein described irregularly shaped scintillators are not limited to having the shape described with regard to FIG. 5A, but rather can have any desired shape.

Figure 5B:
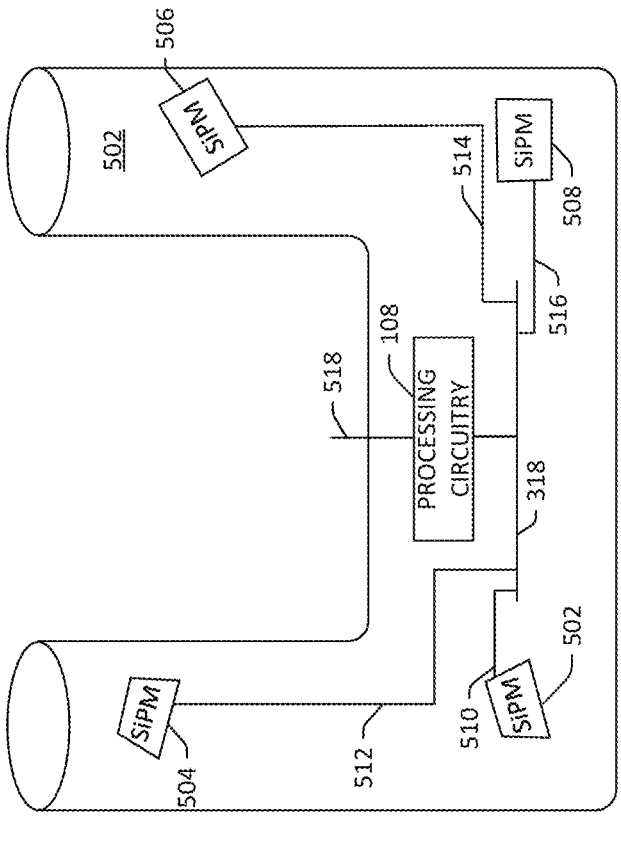
FIG. 5B shows a scintillator detector with processing circuitry and SiPMs embedded therein

FIG. 5B shows the scintillator detector 500, wherein processing circuitry 108 is embedded in the scintillator along with the SiPMs, in accordance with one or more features described herein. The scintillator detector 500 comprises a u-shaped cylindrical scintillator 502 with a plurality of SiPMs 504-512 embedded therein. The SiPMs 504-512 are coupled to respective leads 516-524. Bus 318 is also provided and is coupled to the respective leads 516-524. Processing circuitry 108 is coupled to the bus and receives output signals from the respective SiPMs 504-512 via the respective leads 516-524. A main lead 518 that extends out of the scintillator 502 is provided by which the processing circuitry 108 communicates with an external computing system and/or display, etc. (not shown in FIG. 5B.)

With regard to the placement of the SiPMs of FIGS. 1-5B in the scintillating material, the positions of the SIPMs can be predetermined and/or recorded during manufacture of the scintillators 102, 302, 502. In one embodiment, the SiPMs of FIGS. 1-5B are placed robotically in predetermined positions within a mold or 3D printer chamber. The orientation of the SiPMs can also be predetermined and/or recorded such that the detecting region of a given SiPM can be angled in any desired direction in the x, y, and/or z planes within the scintillator 102, 302, 502.

Figure 6:
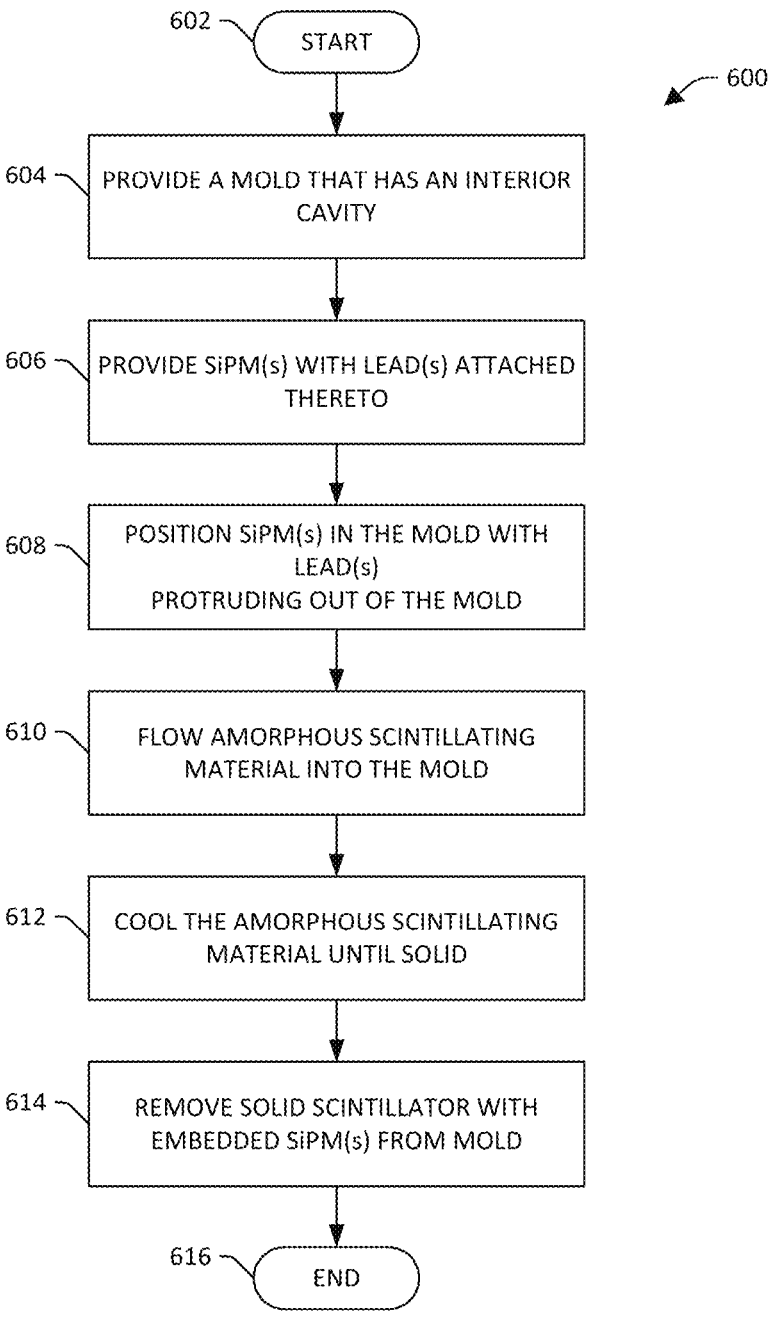
FIG. 6 illustrates a method for manufacturing a scintillator with embedded SiPMs.
Figure 7:
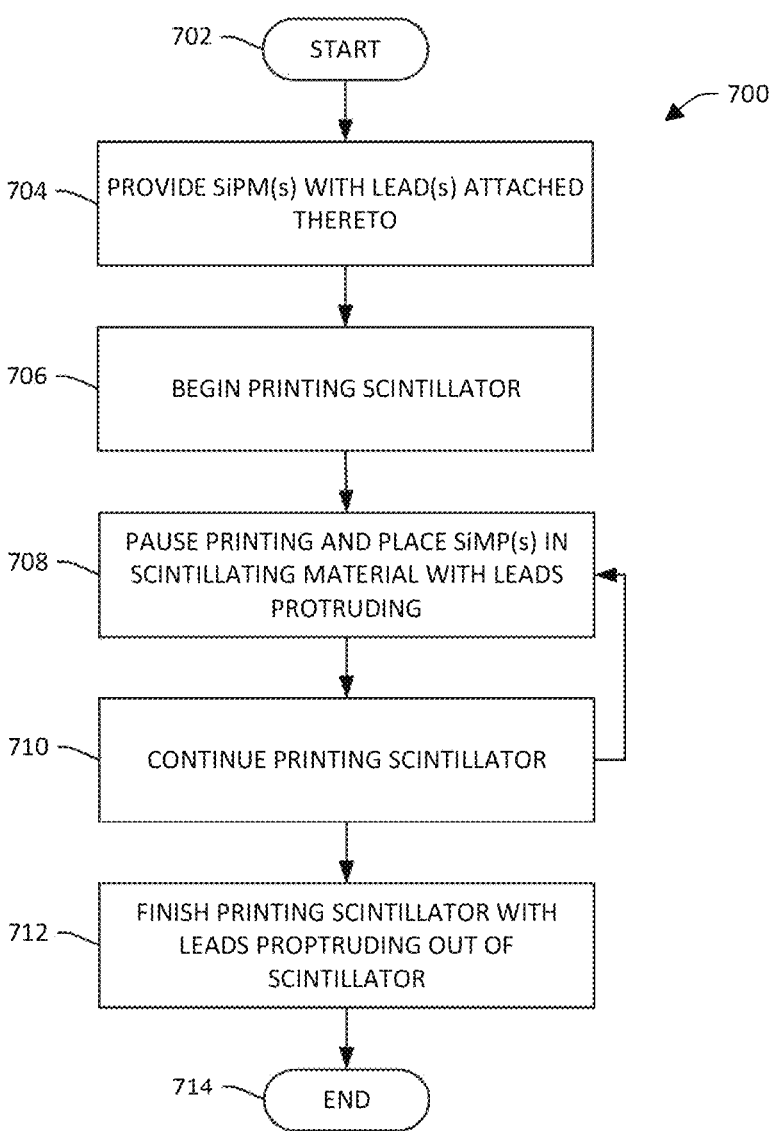
FIG. 7 illustrates a method for printing an irregularly shaped scintillator with SiPMs embedded therein.

FIGS. 6-8 illustrate methods relating to scintillation detectors. While the methods are shown and described as being a series of acts that are performed in a sequence, it is to be understood and appreciated that the methods are not limited by the order of the sequence. For example, some acts can occur in a different order than what is described herein. In addition, an act can occur concurrently with another act. Further, in some instances, not all acts may be required to implement a method described herein.

Referring to FIG. 6, a method 600 for manufacturing a scintillator with embedded SiPMs is illustrated, in accordance with one or more aspects described herein. The method 600 starts at 602, and at 604 a mold having an interior cavity is provided. The mold can be formed of silicone or any other suitable material. At 606, SiPMs with leads attached thereto are provided. At 608, the SiPMs are positioned in the mold with their respective leads protruding out of the mold. At 610, liquid scintillating material is filled into the mold. In one embodiment, the liquid scintillating material is an OGS material that has been heated to a supercooled liquid or stable liquid state. The OGS material is capable of plastic flow at a low temperature (also referred to herein as the glass transition temperature, $T_g$), so that even when heated at or above this value, the temperature of the organic glass material is not high enough to damage the SiPMs. If the glass transition temperature for a particular OGS material is above a temperature tolerance for the SiPM, a plasticizer or polymer can be added to the OGS material to reduce its glass transition temperature to below the temperature tolerance of the SiPM.

At 612, the liquid scintillating material is cooled until it reaches an amorphous solid state. At 614, the amorphous solid scintillator with embedded SiPMs can be removed from the mold. In another embodiment, the mold is left on the amorphous solid scintillator. The method 600 completes at 616.

As will be appreciated by one of skill in the art, acts 608 and 610 need not occur in the order presented in FIG. 6. Rather, in one embodiment, the SiPMs can be positioned in the mold with their leads protruding out of the mold after filling the mold with the liquid scintillating material.

With reference now to FIG. 7, a method 700 for printing an irregularly shaped scintillator with SiPMs embedded therein is presented, in accordance with one or more features described herein. The method 700 starts at 702, and at 704 one or more SiPMs with leads attached thereto are provided. At 706, 3D printing of a scintillator is initiated. In one embodiment, the scintillator is printed using OGS-based feedstock material that exhibits melt-flow characteristics compatible with Fused Deposition Modeling (FDM) or Selective Laser Sintering (SLS) 3D printing processes. At 708, printing is paused and SiPMs are positioned in the printed scintillating material, leaving the SiPM leads protruding from the printed material. In one embodiment, the SIPMs are positioned using robotics to ensure positioning at or near predetermined, known positions. At 710 printing is resumed. The method reverts to 708 for insertion of additional SiPMs, if desired. Once all SiPMs have been inserted in the scintillating material, printing is resumed until completion, with the leads still protruding from the printed scintillator, at 712. The method 700 completes at 714.

In another embodiment, the SiPMs with leads attached thereto are positioned in the 3D printer prior to printing. The printer prints scintillating material on and around the SiPMs, leaving the SiPM leads protruding from the printed scintillator. A thermal post-annealing process may be performed on the scintillator/SiPM assembly at this stage to fuse the monolith to remove optical scattering interfaces associated with the finite resolution of the 3D printed structure.

Turning to FIG. 8, a method 800 for using a scintillation detector having an embedded SiPM is illustrated. The method 800 starts at 802, and at 804 a scintillator generates a photon in response to ionizing radiation impinging upon scintillating material of the scintillator. At 806, an SiPM embedded within the scintillator generates an electrical signal based upon the photon impinging upon the SiPM. At 808, processing circuitry of the scintillation detector generates output that is indicative of a characteristic of the ionizing radiation based on the electrical signa. For instance, the output can be indicative of a type of ionizing radiation and indicate the particle's energy. The method 800 completes at 810.

Figure 9:
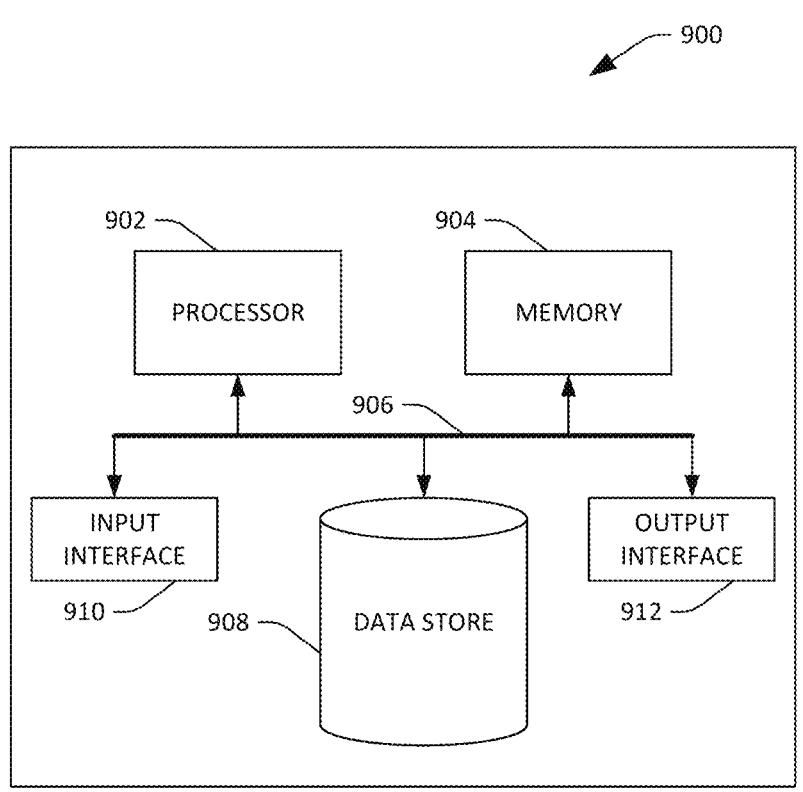
FIG. 9 illustrates a high-level illustration of an exemplary computing device.

Referring now to FIG. 9, a high-level illustration of an exemplary computing device 900 that can be used in accordance with the systems and methodologies disclosed herein is illustrated. For instance, the computing device 900 may be or include the computing system 232 and/or the processing circuitry 108. The computing device 900 includes at least one processor 902 that executes instructions that are stored in a memory 904. The instructions may be, for instance, instructions for implementing functionality described as being carried out by one or more modules, components, or systems discussed above or instructions for implementing one or more of the methods described above. The processor 902 may be a GPU, a plurality of GPUs, a CPU, a plurality of CPUs, a multi-core processor, a combination of the foregoing, etc. The processor 902 may access the memory 904 by way of a system bus 906.

The computing device 900 additionally includes a data store 908 that is accessible by the processor 902 by way of the system bus 906. The data store 908 may include executable instructions, scintillation event data, 3D printing instructions for controlling a 3D printer (not shown) to print a scintillator with embedded SiPMs as described herein, output data, embeddings of these data in latent spaces, etc. The computing device 900 also includes an input interface 910 that allows external devices to communicate with the computing device 900. For instance, the input interface 910 may be used to receive instructions from an external computing device, etc. The computing device 900 also includes an output interface 912 that interfaces the computing device 900 with one or more external devices.

Additionally, while illustrated as a single system, it is to be understood that the computing device 900 may be a distributed system. Thus, for instance, several devices may be in communication by way of a network connection and may collectively perform tasks described as being performed by the computing device 900.

Various functions described herein can be implemented in hardware, software, or any combination thereof. If implemented in software, the functions can be stored on or transmitted over as one or more instructions or code on a computer-readable medium. Computer-readable media includes computer-readable storage media. A computer-readable storage media can be any available storage media that can be accessed by a computer. By way of example, and not limitation, such computer-readable storage media can comprise RAM, ROM, EEPROM, CD-ROM or other optical disk storage, magnetic disk storage or other magnetic storage devices, or any other medium that can be used to store desired program code in the form of instructions or data structures and that can be accessed by a computer. Disk and disc, as used herein, include compact disc (CD), laser disc, optical disc, digital versatile disc (DVD), floppy disk, and Blu-ray disc (BD), where disks usually reproduce data magnetically and discs usually reproduce data optically with lasers. Further, a propagated signal is not included within the scope of computer-readable storage media. Computer-readable media also includes communication media including any medium that facilitates transfer of a computer program from one place to another. A connection, for instance, can be a communication medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio and microwave are included in the definition of communication medium. Combinations of the above should also be included within the scope of computer-readable media.

Alternatively, or in addition, the functionally described herein can be performed, at least in part, by one or more hardware logic components. For example, and without limitation, illustrative types of hardware logic components that can be used include FPGAs, ASICs, Application-specific Standard Products (ASSPs), SOCs, Complex Programmable Logic Devices (CPLDs), etc.

Various aspects are described herein in accordance with at least the following examples.

(A1) In an aspect, a scintillator having a SiPM embedded therein includes an OGS material having a glass transition temperature above which the OGS material exhibits super-cooled liquid characteristics and below which the OGS material is in an amorphous solid state. The scintillator also includes an SiPM having a lead coupled thereto and having a temperature tolerance greater than the glass transition temperature of the OGS material. The SiPM is positioned in the OGS material while the OGS material is above the glass transition temperature, and wherein the OGS material is cooled to the amorphous solid state below the glass transition temperature with the SiPM embedded therein.

(A2) In some embodiments of the scintillator of (A1), the SiPM and the amorphous OGS material are placed in a removable mold, where the amorphous OGS material is cooled to the amorphous solid state in the removable mold.

(A3) In some embodiments of the scintillator of (A2), where the SiPM is positioned in the mold prior to filling the mold with the OGS material.

(A4) In some embodiments of the scintillator of (A2), where the SiPM is positioned in the mold after filling the mold with the OGS material.

(A5) In some embodiments of the scintillator of (A1), the OGS material is printed by a 3D printer, where printing is paused for insertion of the SiPM and resumed after insertion of the SiPM.

(A6) In some embodiments of the scintillator of at least one of (A1)-(A5), the SiPM is positioned at least one attenuation length away from the outer surfaces of the scintillator.

(A7) In some embodiments of the scintillator of at least one of at least one of (A1)-(A6), the scintillator includes at least one of: a) internal reflective material that was mixed into the scintillator material while in an amorphous state, where the internal reflective material reflects light inside the scintillator toward the SiPM; or b) external reflective material positioned on an external surface of the solidified scintillator, where the external reflective material reflects light exiting the scintillator back into the scintillator material for detection by the SiPM.

(A8) In some embodiments of the scintillator of at least one of at least one of (A1)-(A7), the OGS material includes a plasticizer additive that reduces the glass transition temperature of the OGS material to a temperature below the SiPM temperature tolerance and decreases a melt viscosity of the OGS material at a given temperature above the glass transition temperature.

(A9) In some embodiments of the scintillator of at least one of (A1)-(A8), the lead is left protruding from the scintillator for connection to read-out circuitry.

(A10) In some embodiments of the scintillator of at least one of (A1)-(A8), the lead is coupled to read-out circuitry that is embedded in the scintillator with the SiPM.

(B1) In another aspect, a method for manufacturing a solid scintillator having a SiPM embedded therein includes heating an organic glass scintillator (OGS) material to a temperature above a glass transition temperature of the OGS material above which the OGS material is in a supercooled or stable liquid state and below which the OGS material is in an amorphous solid state. The method also includes positioning an SiPM with a lead coupled thereto in an interior cavity of a mold, the SiPM having a temperature tolerance above the glass transition temperature of the OGS material. The method further includes flowing liquid OGS material into the mold. The method additionally includes cooling the OGS material until solid with the SiPM and at least a portion of the lead embedded therein.

(B2) In some embodiments of the method of (B1), the method also includes removing the mold from the solidified OGS material.

(B3) In some embodiments of the method of at least one of (B1)-(B2), the method also includes positioning the SiPM in the mold prior to filling the mold with the OGS material.

(B4) In some embodiments of the method of at least one of (B1)-(B2), the method also includes positioning the SiPM in the mold after filling the mold with the amorphous OGS material.

(B5) In some embodiments of the method of at least one of (B1)-(B4), the glass transition temperature is in the range of 25° C. to 200° C.

(B6) In some embodiments of the method of at least one of (B1)-(B5), the method also includes positioning the SiPM at least one attenuation length away from an outer surface of the scintillator.

(B7) In some embodiments of the method of at least one of (B1)-(B6), the method also includes adding a plasticizer material to the OGS material, where the plasticizer material reduces the glass transition temperature of the OGS material to a temperature below the SiPM temperature tolerance and decreases a melt viscosity at a given temperature above the glass transition temperature.

(B8) In some embodiments of the method of at least one of (B1)-(B7), the method also includes using active cooling to cool the amorphous OGS material to reduce SiPM exposure to heat.

(C1) In another aspect, a solid scintillator is disclosed herein, where the solid scintillator is manufactured according to the method of at least one of (B1)-(B8).

(D1) In yet another aspect, a system for manufacturing a solid scintillator with a SiPM embedded therein includes a heat source that applies heat to an OGS material to maintain the OGS material in a liquid state above a glass transition temperature of the OGS material. The system also includes a computing system that controls the heat source. The system further includes a temperature monitor that monitors a temperature of the OGS material and which provides OGS material temperature information to the computing system. The system additionally includes a mold having an interior cavity that receives amorphous OGS material. The system also includes a SiPM that is placed in the mold and is coupled to a lead that protrudes from the mold and the amorphous OGS material, wherein the SiPM has a temperature tolerance that is higher than the glass transition temperature.

(D2) In some embodiments of the system of (D1), the system also includes an active cooling component that accelerates cooling of the amorphous OGS material with the SiPM embedded therein and reduces exposure of the SiPM to heat.

What has been described above includes examples of one or more embodiments. It is, of course, not possible to describe every conceivable modification and alteration of the above devices or methodologies for purposes of describing the aforementioned aspects, but one of ordinary skill in the art can recognize that many further modifications and permutations of various aspects are possible. Accordingly, the described aspects are intended to embrace all such alterations, modifications, and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A scintillator having a silicon photomultiplier (SiPM) embedded therein, comprising;
   an organic glass scintillator (OGS) material having a glass transition temperature above which the OGS material exhibits supercooled liquid characteristics and below which the OGS material is in an amorphous solid state; and
   an SiPM having a lead coupled thereto and having a temperature tolerance greater than the glass transition temperature of the OGS material;
   wherein the SiPM is positioned in the OGS material while the OGS material is above the glass transition temperature, and wherein the OGS material is cooled to the amorphous solid state below the glass transition temperature with the SiPM embedded therein.

2. The scintillator of claim 1, wherein the SiPM and the amorphous OGS material are placed in a removable mold, where the amorphous OGS material is cooled to the amorphous solid state in the removable mold.

3. The scintillator of claim 2, wherein the SiPM is positioned in the mold prior to filling the mold with the OGS material.

4. The scintillator of claim 2, wherein the SiPM is positioned in the mold after filling the mold with the OGS material.

5. The scintillator of claim 1, wherein the OGS material is printed by a 3D printer, and wherein printing is paused for insertion of the SiPM and resumed after insertion of the SiPM.

6. The scintillator of claim 1, wherein the SiPM is positioned at least one attenuation length away from the outer surfaces of the scintillator.

7. The scintillator of claim 1, further comprising at least one of:
   internal reflective material that was mixed into the scintillator material while in an amorphous state, wherein the internal reflective material reflects light inside the scintillator toward the SiPM; or
   external reflective material positioned on an external surface of the solidified scintillator, wherein the external reflective material reflects light exiting the scintillator back into the scintillator material for detection by the SiPM.

8. The scintillator of claim 1, wherein the OGS material includes a plasticizer additive that reduces the glass transition temperature of the OGS material to a temperature below the SiPM temperature tolerance and decreases a melt viscosity of the OGS material at a given temperature above the glass transition temperature.

9. The scintillator of claim 1, wherein the lead is left protruding from the scintillator for connection to read-out circuitry.

10. The scintillator of claim 1, wherein the lead is coupled to read-out circuitry that is embedded in the scintillator with the SiPM.

11. A method for manufacturing a solid scintillator having a silicon photomultiplier (SiPM) embedded therein, the method comprising:

heating an organic glass scintillator (OGS) material to a temperature above a glass transition temperature of the OGS material above which the OGS material is in a supercooled or stable liquid state and below which the OGS material is in an amorphous solid state;

positioning an SiPM with a lead coupled thereto in an interior cavity of a mold, the SiPM having a temperature tolerance above the glass transition temperature of the OGS material;

flowing liquid OGS material into the mold; and cooling the OGS material until solid with the SiPM and at least a portion of the lead embedded therein.

12. The method of claim 11, further comprising removing the mold from the solidified OGS material.

13. The method of claim 11, further comprising positioning the SiPM in the mold prior to filling the mold with the OGS material.

14. The method of claim 11, further comprising positioning the SiPM in the mold after filling the mold with the amorphous OGS material.

15. The method of claim 11, wherein the glass transition temperature is in the range of 25° C. to 200° C.

16. The method of claim 11, further comprising positioning the SiPM at least one attenuation length away from an outer surface of the scintillator.

17. The method of claim 11, further comprising adding a plasticizer material to the OGS material, wherein the plasticizer material reduces the glass transition temperature of the OGS material to a temperature below the SiPM temperature tolerance and decreases a melt viscosity at a given temperature above the glass transition temperature.

18. The method of claim 11, further comprising using active cooling to cool the amorphous OGS material to reduce SiPM exposure to heat.

19. A system for manufacturing a solid scintillator with a silicon photomultiplier (SiPM) embedded therein, the system comprising:

a heat source that applies heat to an organic glass scintillator (OGS) material to maintain the OGS material in a liquid state above a glass transition temperature of the OGS material;

a computing system that controls the heat source;

a temperature monitor that monitors a temperature of the OGS material and which provides OGS material temperature information to the computing system;

a mold having an interior cavity that receives amorphous OGS material; and a SiPM that is placed in the mold and is coupled to a lead that protrudes from the mold and the amorphous OGS material, wherein the SiPM has a temperature tolerance that is higher than the glass transition temperature.

20. The system of claim 19, further comprising an active cooling component that accelerates cooling of the amorphous OGS material with the SiPM embedded therein and reduces exposure of the SiPM to heat.

* * * * *